United States Patent
Gonzalez et al.

(10) Patent No.: US 10,754,607 B2
(45) Date of Patent: Aug. 25, 2020

(54) RECEIVER AND DECODER FOR EXTREME LOW POWER, UNTERMINATED, MULTI-DROP SERDES

(71) Applicant: QUALCOMM Incorporated, San Diego, CA (US)

(72) Inventors: Jason Gonzalez, Solana Beach, CA (US); Puxuan Dong, San Diego, CA (US); Lior Amarilio, Yokneam (IL)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/451,553

(22) Filed: Jun. 25, 2019

(65) Prior Publication Data

US 2020/0097245 A1    Mar. 26, 2020

Related U.S. Application Data

(60) Provisional application No. 62/736,642, filed on Sep. 26, 2018.

(51) Int. Cl.
| | | |
|---|---|---|
| *G06F 3/16* | (2006.01) | |
| *H04R 27/00* | (2006.01) | |
| *H04L 12/40* | (2006.01) | |
| *G06F 3/12* | (2006.01) | |
| *H03M 1/06* | (2006.01) | |
| *H04L 25/02* | (2006.01) | |
| *H03K 19/0185* | (2006.01) | |

(52) U.S. Cl.
CPC ............. *G06F 3/162* (2013.01); *H04L 12/40* (2013.01); *H04R 27/00* (2013.01); *G06F 3/12* (2013.01); *H03K 19/018528* (2013.01); *H03M 1/0646* (2013.01); *H04L 25/0272* (2013.01); *H04L 25/0292* (2013.01)

(58) Field of Classification Search
CPC . G06F 3/12; G06F 3/162; H04L 12/40; H04L 25/0292; H04L 25/0272; H04R 27/00; H03M 1/0646; H03K 19/018528
See application file for complete search history.

(56) References Cited

U.S. PATENT DOCUMENTS 6,396,329 B1 *  5/2002  Zerbe ........................ G11C 7/02
                                                    327/319
6,452,422 B1 *  9/2002  Suzuki ................. H03K 17/145
                                                    326/112

(Continued)

OTHER PUBLICATIONS

Watterson, LVDS and M LVDS Implementation Guide, Analog Devices (Year: 2013).*

*Primary Examiner* — Davetta W Goins
*Assistant Examiner* — Kuassi A Ganmavo
(74) *Attorney, Agent, or Firm* — Qualcomm Incorporated

(57) ABSTRACT

Systems and methods for multi-threshold sensing at an audio receiver, and systems and methods for calibrating an audio system to optimize for the specific configuration of the audio system are disclosed herein. In some implementations of a multi-threshold receiver, at least one additional voltage level is selected to trigger latching events within the receiver based on changes of the receiver input (which includes differential signals Vp and Vn) and in turn, to generate internal signals within the multi-threshold receiver, and then logic operations are performed on these internal signals to generate the output of the multi-threshold receiver.

12 Claims, 16 Drawing Sheets

(56) References Cited

U.S. PATENT DOCUMENTS

| | | | | |
|---|---|---|---|---|
| 7,719,324 | B1* | 5/2010 | Snowdon | H03K 19/018528 326/82 |
| 2009/0167369 | A1* | 7/2009 | Liu | H03K 19/018528 327/108 |
| 2011/0026612 | A1* | 2/2011 | Lombardo | H04L 25/0266 375/257 |
| 2016/0337741 | A1* | 11/2016 | Amarilio | H04R 3/005 |
| 2017/0063700 | A1* | 3/2017 | Wang | H04L 47/25 |
| 2018/0139076 | A1* | 5/2018 | Watabe | H04L 25/028 |

* cited by examiner

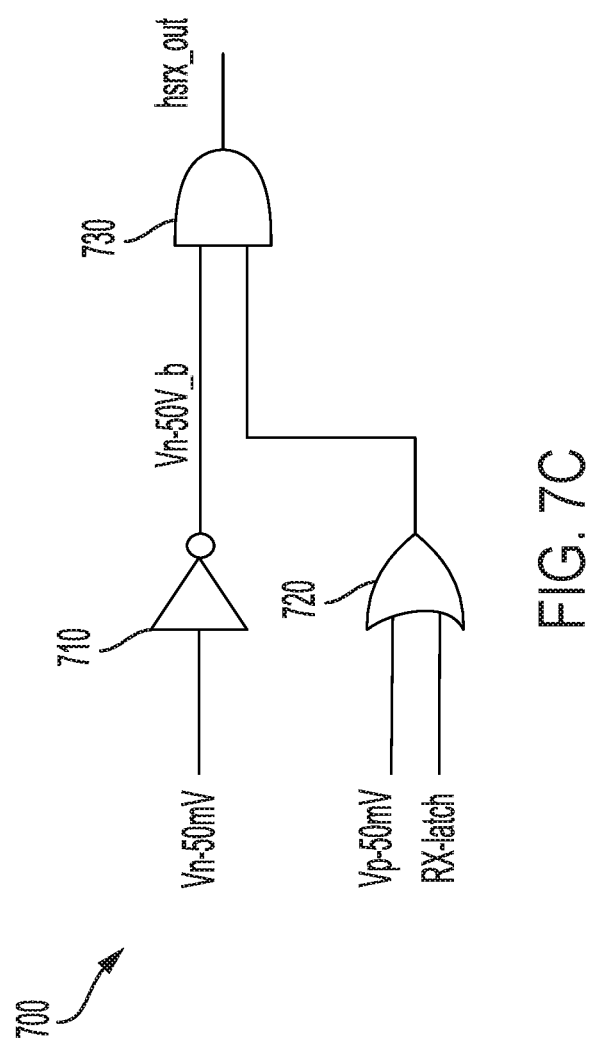

RECEIVER AND DECODER FOR EXTREME LOW POWER, UNTERMINATED, MULTI-DROP SERDES

CLAIM OF PRIORITY UNDER 35 U.S.C. § 119

The present Application for Patent claims priority to Provisional Application No. 62/736,642 entitled "Receiver and decoder for extreme low power, unterminated, multi-drop SerDes" filed Sep. 26, 2018, and assigned to the assignee hereof and hereby expressly incorporated by reference herein.

BACKGROUND

I. Field of the Disclosure

The technology of the disclosure relates generally to audio buses and, more particularly, to receivers coupled to a unterminated, multi-drop serializer/deserializer (SerDes) audio bus.

II. Background

Mobile communication devices have become increasingly common in current society. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences.

The mobile communication devices commonly include at least one microphone and multiple speakers. The microphone and the speakers used in the mobile communication devices typically have analog interfaces which require a dedicated two-wire connection between each pair of devices. Since a mobile communication device is capable of supporting multiple audio devices, it may be desired to allow a microprocessor or other control device in the mobile communication device to communicate audio data to multiple audio devices over a common communication bus simultaneously.

In this regard, the MIPI® Alliance initially developed the Serial Low-power Inter-chip Media Bus (SLIMbus$^{SM}$ or SLIMBUS) to handle audio signals within a mobile communication device. The first release was published in October 2005 with v1.01 released on Dec. 3, 2008. In response to industry feedback, MIPI has also developed Sound-Wire$^{SM}$ (SOUNDWIRE), a communication protocol for a processor in the mobile communication device (the "master") to control distribution of digital audio streams between one or more audio devices (the "slave(s)") via one or more SOUNDWIRE slave data ports. Version 1 was released Jan. 21, 2015.

However, as mobile audio systems become more complex, a more advance standard is needed to accommodate the demands of next generation mobile devices and systems. Since the deployment of SOUNDWIRE, the MIPI® Alliance has been developing a next-generation SOUNDWIRE standard to accommodate more complex and advance requirements of mobile audio systems, namely, SOUND-WIRE-Next.

SUMMARY OF THE DISCLOSURE

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. The sole purpose of this summary is to present some concepts of one or more implementations in a simplified form as a prelude to the more detailed description that is presented later.

In some implementations of a multi-threshold receiver, at least one additional voltage level is selected to trigger latching events within the receiver based on changes of the receiver input (which includes differential signals Vp and Vn) and in turn, to generate internal signals within the multi-threshold receiver, and then logic operations are performed on these internal signals to generate the output of the multi-threshold receiver.

In some implementations, the additional voltage level is about a quarter of (Vp–Vn).

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE FIGURES

FIG. 7C is a circuit diagram of one implementation of a multi-threshold sensing receiver.

DETAILED DESCRIPTION

Figure 1:
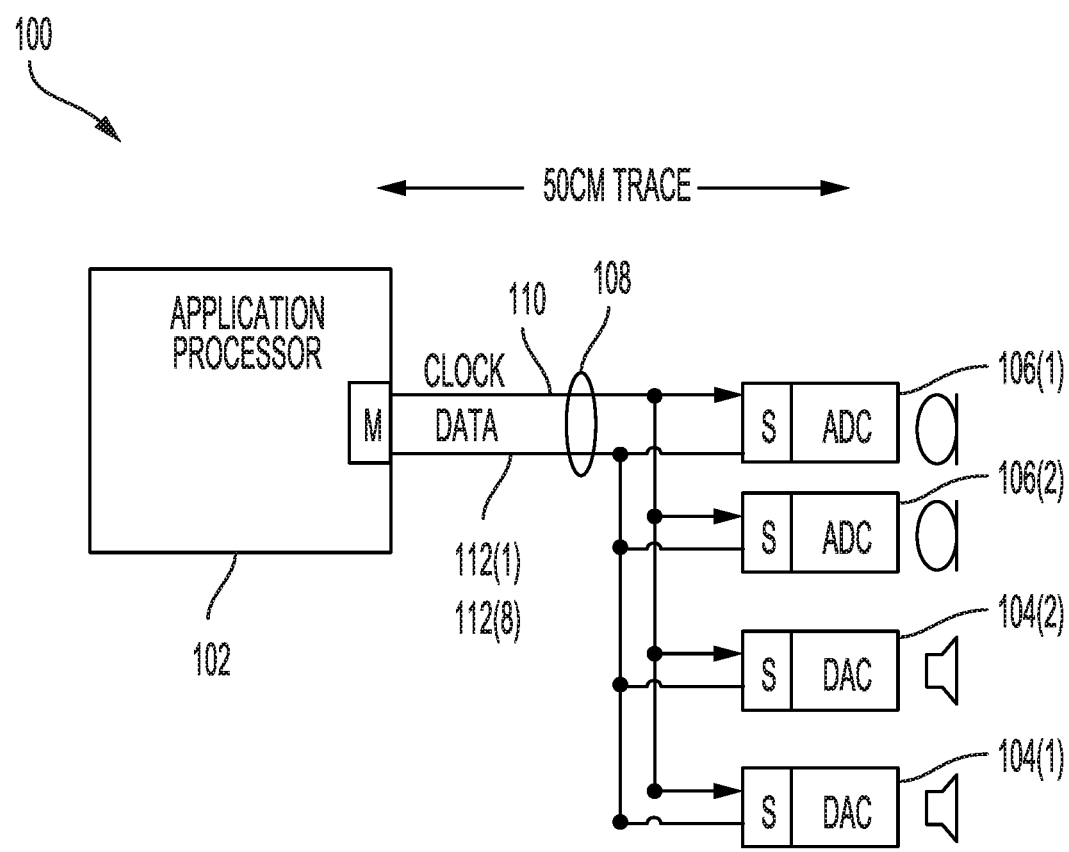
FIG. 1 is a simplified block diagram of an exemplary audio system using a SOUNDWIRE audio bus to transport audio data that incorporates exemplary power conservation techniques.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

As alluded to above, the MIPI® Alliance is developing SOUNDWIRE-Next standard, which has many features not previously supported by SOUNDWIRE added. According to one aspect, SOUNDWIRE-Next defines the next generation audio standard using a single differential interface to handle multi-drop (e.g., about 10 devices), long range serializer/deserializer (SerDes) data transmission. A single differential wire (e.g., 50 cm cable) can be provided between a master and a plurality of slaves. According to SOUNDWIRE-Next standard, receivers at the slaves do not have termination so line reflections, impedance discontinuities, and line propagation delays are all factors which impede the bandwidth of operation of the physical interface.

Aspects disclosed in the detailed description include systems and methods for multi-threshold sensing in a SOUNDWIRE-Next slave's receiver, which is also referred to as a multi-threshold receiver. In some implementations of a multi-threshold receiver, at least one additional voltage level is selected to trigger latching events within the receiver based on changes of the receiver input (which includes differential signals Vp and Vn) and in turn, to generate internal signals within the multi-threshold receiver, and then logic operations are performed on these internal signals to generate the output of the multi-threshold receiver.

Before addressing exemplary multi-threshold sensing in a SOUNDWIRE-Next slave's receiver, a brief overview of a SOUNDWIRE audio system is provided below with reference to FIG. 1 with a more detailed view of a conventional audio source coupled to an audio sink provided with reference to FIG. 2.

In this regard, FIG. 1 is block diagram of an exemplary SOUNDWIRE audio system 100. The SOUNDWIRE audio system 100 includes an application processor 102 coupled to a plurality of microphones 104(1)-104(2) and a plurality of speakers 106(1)-106(2) by a multi-wire bus 108. The multi-wire bus 108 includes a clock line 110 and one or more (up to eight) data lines 112(1)-112(8). The application processor 102 is generally regarded as a master of the SOUNDWIRE audio system 100, and the plurality of microphones 104(1)-104(2) and the plurality of speakers 106(1)-106(2) (as well as any other audio components) are slaves. It should further be appreciated that the microphones 104(1)-104(2) are examples of audio sources (i.e., components that place audio data onto the multi-wire bus 108), and the speakers 106(1)-106(2) are examples of audio sinks (i.e., components that receive audio data from the multi-wire bus 108). The application processor 102 may be an audio source or an audio sink as is well understood. While illustrated as the application processor 102, it should be appreciated that the application processor 102 could be replaced by a codec (not illustrated). Although the system shown in FIG. 1 has separate clock and data differential pairs, some other implementations can have only one differential pair for data, in which case the data sends the clock timing information periodically on an edge that could happen up to once every 8 PHUIs (PHY Unit Intervals), 12 PHUIs, 16 PHUIs, 24 PHUIs, etc., up to 32 PHUIs.

While many audio elements rely on pulse code modulation (PCM) to encode audio streams, there are a number of elements, particularly certain microphones, that use PDM encoding. An overview of a simple conventional PDM-based audio source-audio sink in a SOUNDWIRE audio system 200 is provided with reference to FIG. 2. The SOUNDWIRE audio system 200 includes an audio source 202, which may be a codec, a microphone, or the like. Similarly, the SOUNDWIRE audio system 200 includes an audio sink 204, which may be a speaker, a codec, or the like. The audio source 202 includes a PDM port 206 as well as other ports 208(1)-208(N) which provide data streams that are multiplexed by a multiplexer 210 to an encoding physical layer (PHY) 212. A control system 214 controls which data stream is provided to the encoding PHY 212. The encoding PHY 212 places the now encoded data on a physical data lane 216 of a SOUNDWIRE bus.

Figure 2:
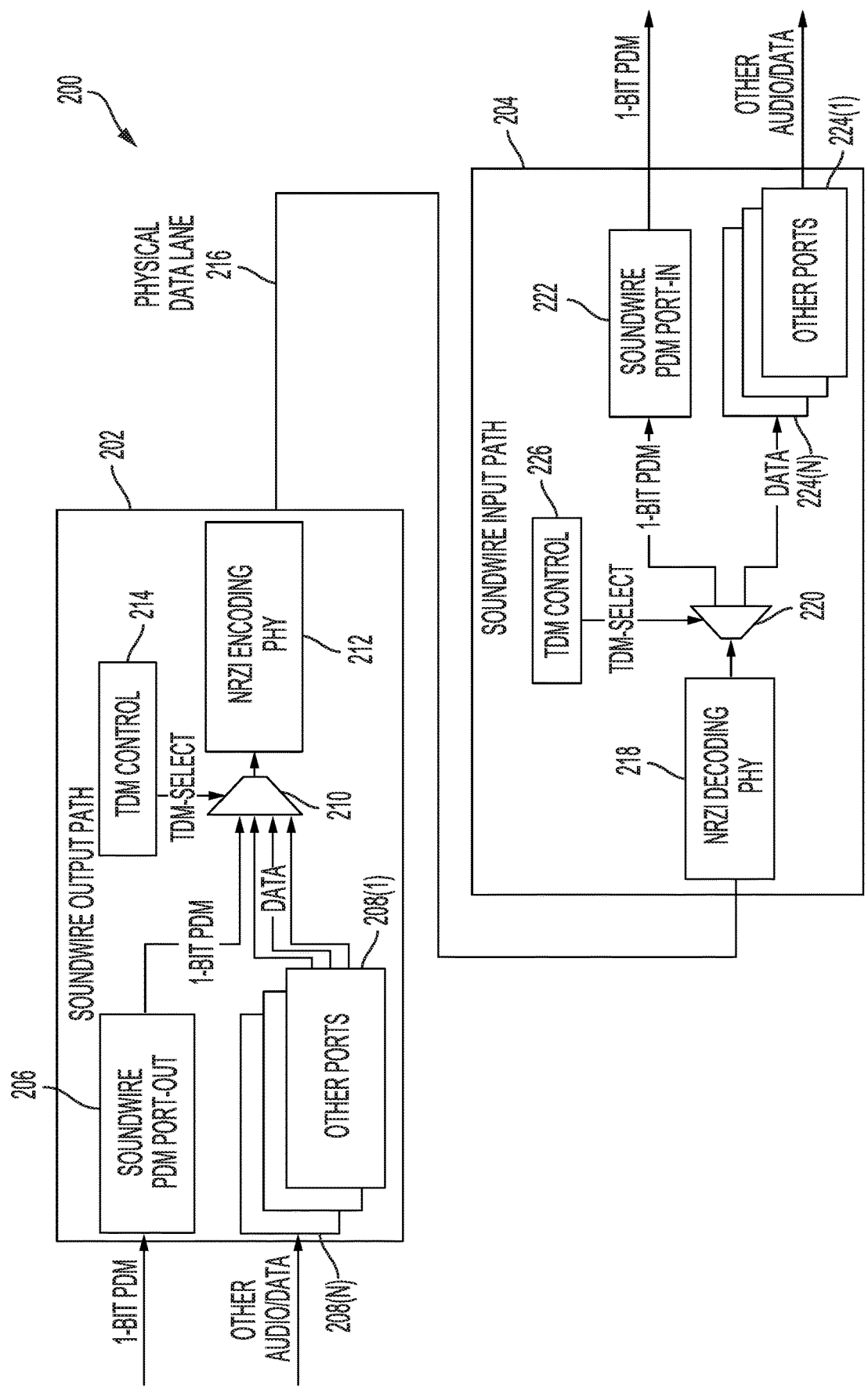
FIG. 2 is a simplified block diagram of a conventional audio source coupled to a conventional audio sink over a SOUNDWIRE audio bus.

With continued reference to FIG. 2, the audio sink 204 includes a decoding PHY 218 that receives the data from the physical data lane 216 and decodes the encoded data. The decoding PHY 218 passes the decoded data to a demultiplexer 220 that separates the data to a SOUNDWIRE PDM port 222 and other ports 224(1)-224(N). A control system 226 controls the demultiplexer 220 as is well understood.

Audio System Topologies

Figure 3A:
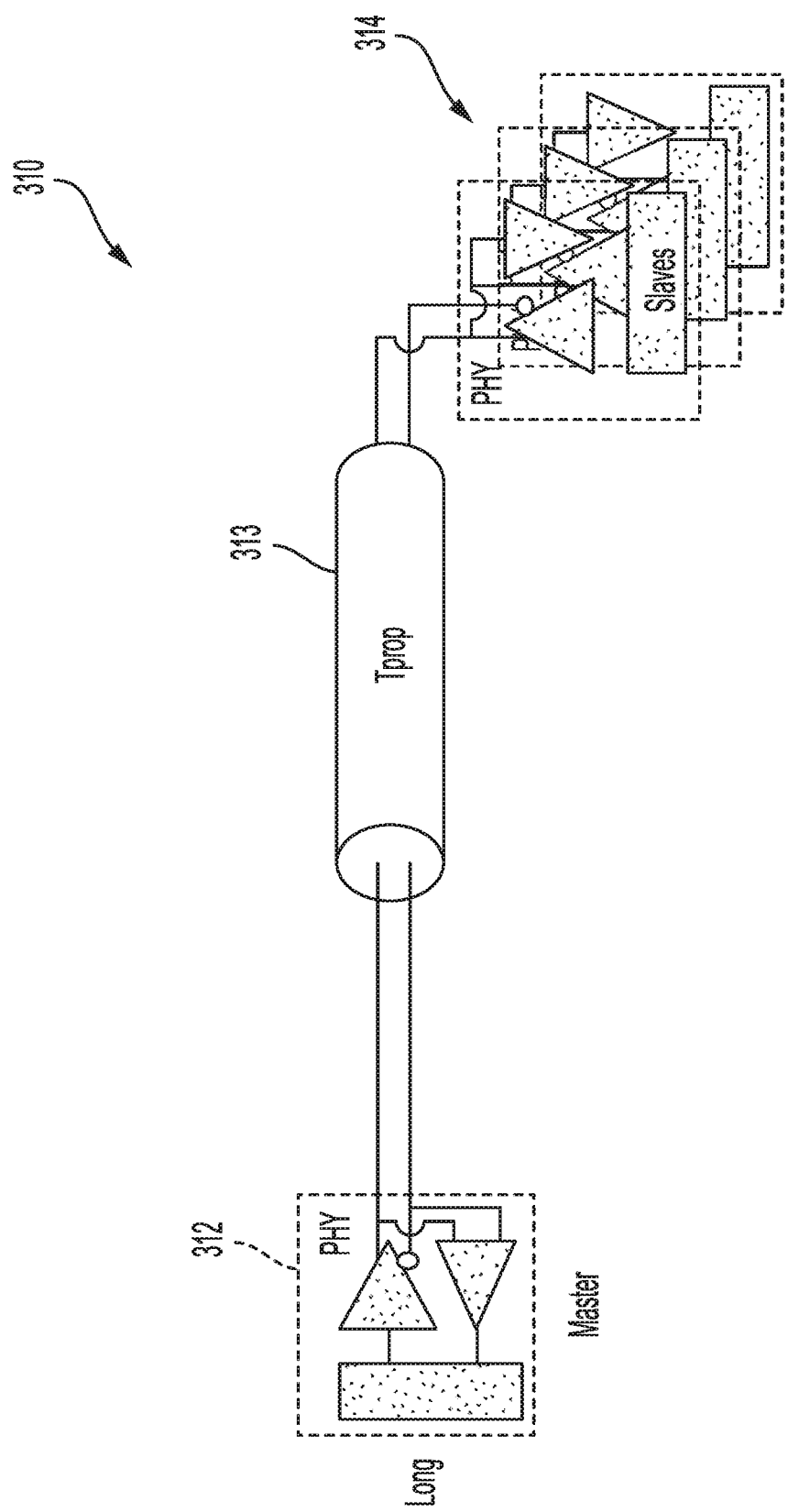
FIGS. 3A-3B show existing SOUNDWIRE audio system topologies.
Figure 3B:
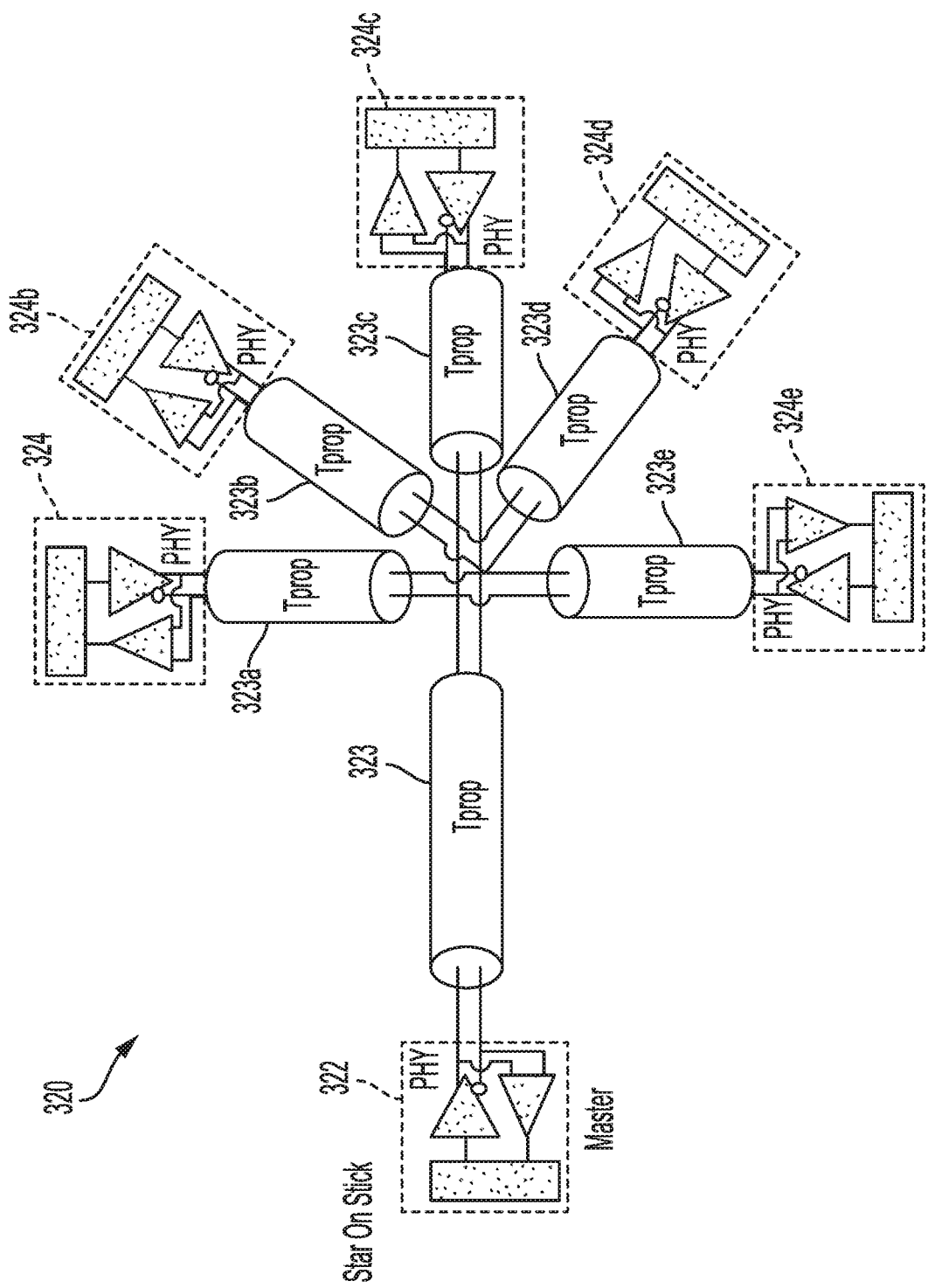

SOUNDWIRE audio systems can be configured into different topologies. FIGS. 3A and 3B illustrate two conventional topologies of SOUNDWIRE audio system. The topology 310 in FIG. 3A is a simple conventional topology, which includes a master 312, a SOUNDWIRE audio bus 313, and a plurality of slaves 314. The master 312 is coupled to one end of the SOUNDWIRE audio bus 313, and the plurality of slaves 314 are coupled to the other end of the SOUNDWIRE audio bus 313. The end to which the master 312 is coupled to is sometimes referred to as the near end because this end is near the master 312 physically. Likewise, the other end to which the slaves 314 are coupled to is sometimes referred to as the far end because this end is farther away from the master 312 physically. The topology 310 can also be referred to as a "Long Configuration." The 2-wires shown in the SOUNDWIRE audio bus 313 represent Vp and Vn in the waveform diagrams shown in FIG. 4. There is no separate clock lane in the SOUNDWIRE audio bus 313.

FIG. 3B illustrates an alternative topology of a SOUNDWIRE audio system. The topology 320 in FIG. 3B includes a master 322, a SOUNDWIRE audio bus 323, a plurality of SOUNDWIRE audio bus extensions 323a-323e, and sets of a plurality of slaves 324a-324e. Each set of the sets of plurality of slaves 324a-324e is coupled to a corresponding one of the SOUNDWIRE audio bus extensions 323a-323e. For instance, the plurality of slaves 324a are coupled to SOUNDWIRE audio bus extension 323a, the plurality of slaves 324b are coupled to SOUNDWIRE audio bus extension 323b, and so forth. The plurality of SOUNDWIRE audio bus extensions 323a-323e are all coupled to the SOUNDWIRE audio bus 323 at one end, while the master 322 is coupled to the other end of the SOUNDWIRE audio bus 323. Topology 320 is also commonly referred to as a "Star on a Stick Topology." The 2-wires shown in the SOUNDWIRE audio bus 323 represent Vp and Vn in the waveform diagrams shown in FIG. 4. There is no separate clock lane in the SOUNDWIRE audio bus 323.

One commonality between topology 310 and topology 320 is the lack of slave connected to the SOUNDWIRE audio bus 313/323 at the end near the master 312/322. This is because long range topologies result in waveforms limiting operation for slaves located near the master. As mentioned above, the latest SOUNDWIRE standard being developed, namely, SOUNDWIRE-Next, defines a new audio standard using a single differential interface to handle multi-drop (e.g., about 10 devices), long range (e.g., 50 cm or longer cable) SerDes data transmission. The standard does not have termination so line reflections, impedance discontinuities, and line propagation delays are all factors which slow down the bandwidth of operation of the physical interface. A novel method and apparatus to receive and sense audio signals described in details below provide a solution to these problems by providing more noise immunity, better timing margin at the slaves, higher maximum possible bandwidth of operation, and a low power unterminated configuration.

Figure 3C:
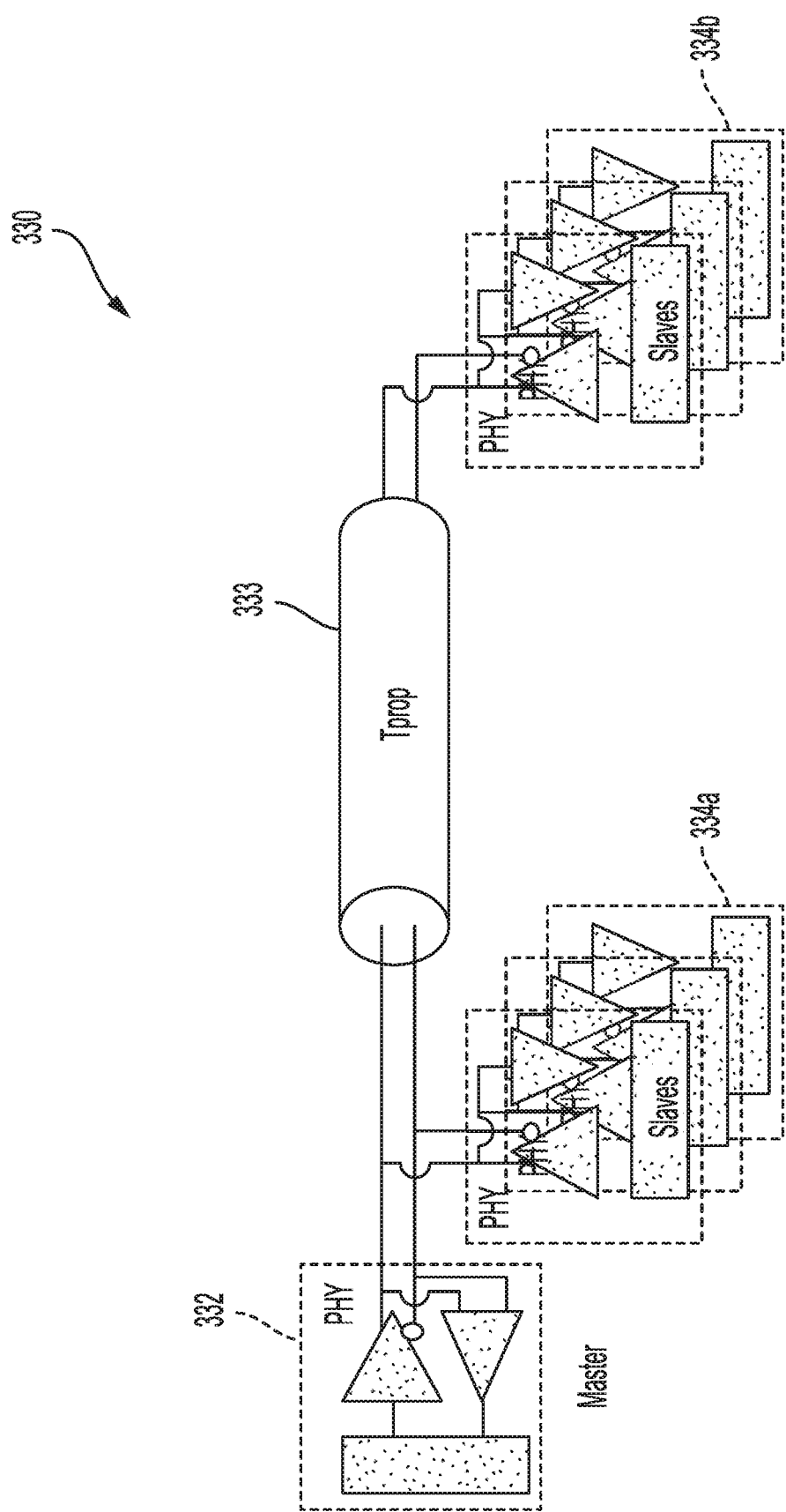
FIG. 3C shows one implementation of a SOUNDWIRE-Next audio system topology.

One implementation of a novel topology 330 of a proposed SOUNDWIRE-Next audio system is shown in FIG. 3C. The topology 330 includes a master 332, a SOUNDWIRE audio bus 333, a first plurality of slaves 334a, and a second plurality of slaves 334b. The 2-wires shown in the SOUNDWIRE audio bus 333 represent Vp and Vn in the waveform diagrams shown in FIGS. 4-6. There is no separate clock lane in the SOUNDWIRE audio bus 333. There is no separate clock lane in SOUNDWIRE-Next, but the multi-threshold sensing technique disclosed herein can help a separate clock lane or any additional data lanes if such additional lanes are present. The master 332 is coupled to one end of the SOUNDWIRE audio bus 333 and the second plurality of slaves 334b are coupled to the other end of the SOUNDWIRE audio bus 333. Unlike the second plurality of slaves 334b, the first plurality of slaves 334a are coupled to the SOUNDWIRE audio bus 333 near the master 332. Thus, slaves 334a may be referred to as the near end slaves and slaves 334b may be referred to as the far end slaves. For example, near end slaves are usually connected to a master by an audio bus or cable of 50 cm or shorter; whereas far end slaves are usually connected to a master by an audio bus or cable of 50 cm or longer. As mentioned above, slaves 334a may suffer from issues such as line reflections, impedance discontinuities, and line propagation delays due to the slaves' 334a close proximity to the master 332.

One solution to mitigate the issues the near end slaves 334a may suffer is to boost transmitter output of the master 332. By boosting transmitter output, the eye opening of the signal can be widened or improved at both near end slaves 334a and far end slaves 334b. This approach may also improve signal turn-around time, i.e., the time the signal takes to transmit back and forth between the master 332 and the slaves 334a or between the master 332 and the slaves 334b. However, boosting transmitter output comes at the cost of higher power consumption, which is a significant problem for mobile systems.

Figure 4:
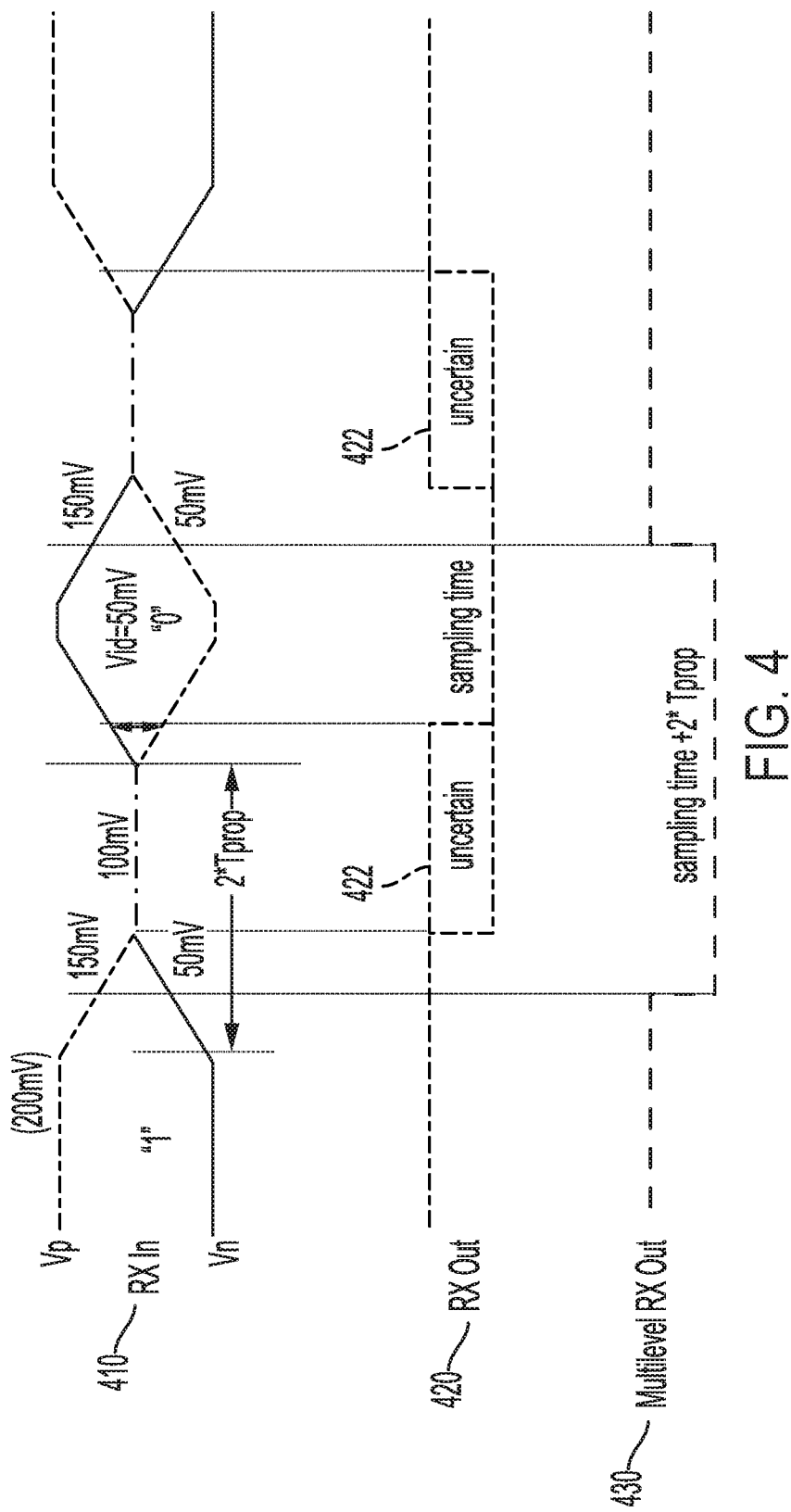
FIG. 4 illustrates input and output waveforms of one implementation of a multi-threshold sensing receiver.

An alternative solution to mitigate the issues of the near end slaves 334a is to provide multi-threshold or multi-threshold sensing at the receivers of the near end slaves 334a. Such receivers may also be referred to as multi-threshold receivers or multi-threshold receivers. Conventional audio receivers typically use a single cross-over point or cross-over voltage level (e.g., the mid-point or mid-rail voltage level between the maximum voltage and the minimum voltage of signals received) to sense incoming differential signals in order to detect if a signal transition has occurred. However, the noise of unterminated transmission line (such as the SOUNDWIRE audio bus 333) often creates multiple cross-over points and increases the bit error rate (BER). FIG. 4 shows a typical waveform diagram of receiver input 410, corresponding output of a conventional receiver 420, and corresponding output of a multi-threshold receiver 430.

Referring to FIG. 4, the receiver input 410 includes a pair of differential signals, namely, Vp and Vn. Initially, receiver input 410 carries a logical "1" as Vp is at the maximum voltage level (Vmax) and Vn is at the minimum voltage level (Vmin). As the signal also travels down the SOUNDWIRE audio bus 333 to the far end slaves 334b and then travels back, the signal at the receivers of the near end slaves 334a may be indeterminate during propagation of the signal on the SOUNDWIRE audio bus 333 due to line reflection and impedance discontinuities. This period of uncertainty 422 is approximately twice the propagation delay (Tprop) of the signal on the SOUNDWIRE audio bus 333 (i.e., 2×Tprop). As a result, the sampling window of the conventional receiver, as well as the bandwidth of the system, is limited. To solve this problem, near end slaves 334a can use a multithreshold receiver instead. In some implementations of a multithreshold receiver, at least one additional voltage level is selected to trigger latching events within the receiver based on changes of the receiver input 410 (which includes differential signals Vp and Vn) and in turn, to generate internal signals within the multi-threshold receiver, and then logic operations are performed on these internal signals to generate the output 430 of the multi-threshold receiver. As shown in FIG. 4, the multi-threshold receiver output 430 does not have a period of uncertainty, and thus, the multi-threshold receiver provides a wider sampling window and improved bandwidth than the conventional receiver does. Some implementations of the multi-threshold receiver are further described below.

Figure 5:
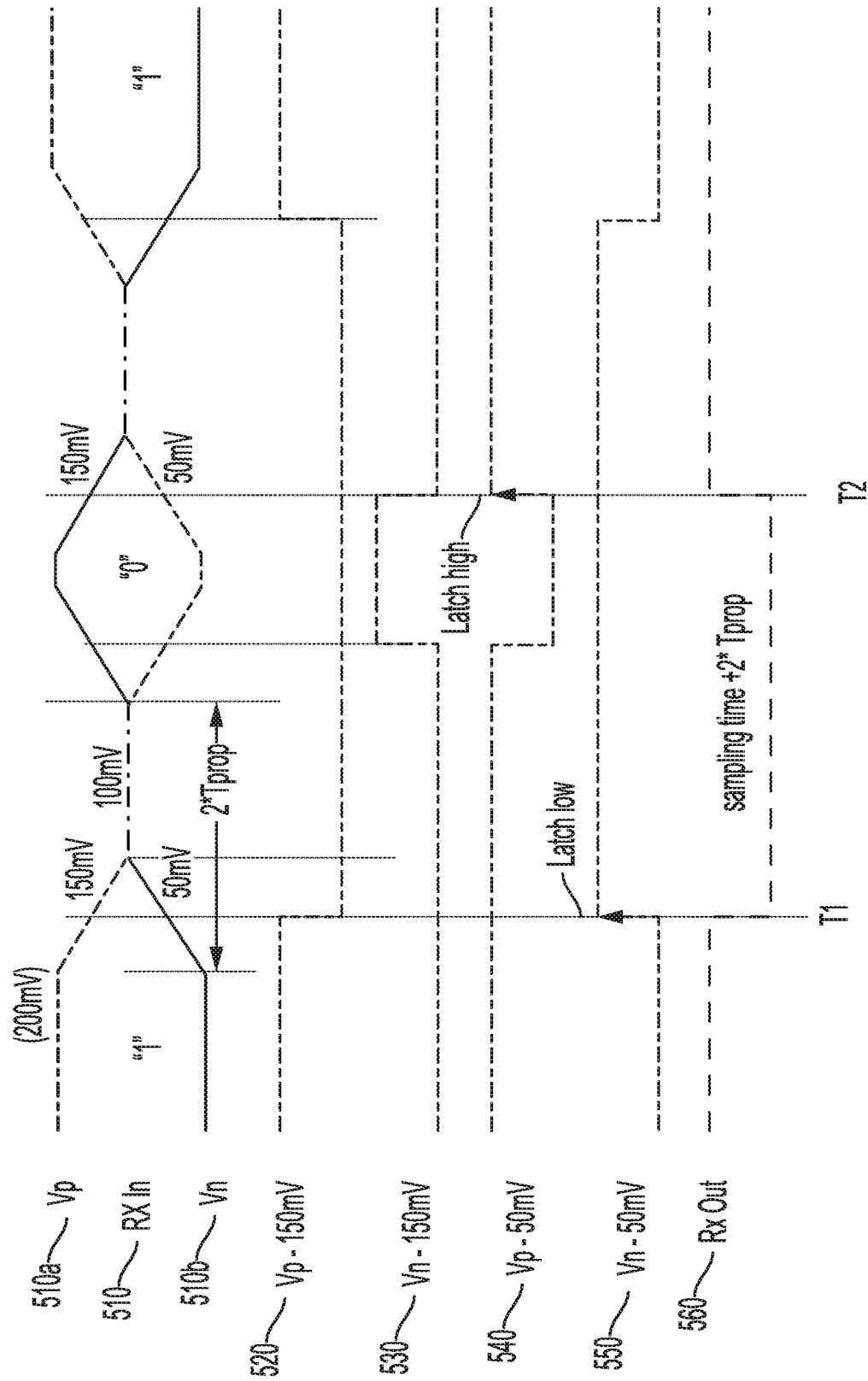
FIG. 5 illustrates input and output waveforms of one implementation of a multi-threshold sensing receiver.

FIG. 5 shows another waveform diagram of some implementations of a multi-threshold receiver. The waveform diagram includes an input 510 received by the multi-threshold receiver (which includes a pair of differential signals Vp 510a and Vn 510b), an internal signal Vp—150 mV 520, an internal signal Vn—150 mV 530, an internal signal Vp—50 mV 540, an internal signal Vn—50 mV 550, and an output of the multi-threshold receiver 560. In the current example, the maximum voltage Vmax of the input voltage 510 is about 200 mV and the minimum voltage Vmin of the input 510 is 0 V (i.e., ground). Initially, Vp is at 200 mV and Vn is at 0 V, and hence, the receiver input 510 carries a logical "1".

In some implementations, the multi-thresholdreceiver selects at least one trigger voltage in addition to the midpoint of Vmax and Vmin typically used for receiver sensing (or sampling). In the current example, the additional trigger voltage selected is ¼ of (Vmax−Vmin)=50 mV. This additional trigger voltage may be referred to as inrefm. One more trigger voltage, inrefp, which can be set at 150 mV, may be used as well. The trigger voltage of 50 mV is chosen in this example for tighter coupling to ground and hence, better peak signal to noise ratio (PSNR). However, one of skill in the art would recognize that other voltage level(s) can be chosen in different implementations. The internal signal Vp—150 mV 520 transitions from high to low when Vp falls below 150 mV. The internal signal Vn—150 mV 530 transitions from low to high when Vn rises above 150 mV. The internal signal Vp—50 mV 540 transitions from high to low when Vp falls below 50 mV. The internal signal Vn—50 mV 550 transitions from low to high when Vn rises above 50 mV. It is observed that when Vp 510a falls from Vmax (200 mV) dropping below 150 mV and when Vn 510*b* rises from Vmin (0 V) passing above 50 mV, the receiver input 510 is likely to transition from a logical "1" to a logical "0". However, as discussed above with reference to FIG. 4, the output 420 of a conventional receiver in a near end slave is likely to enter a period of uncertainty 422 at this point in time, during which the conventional receiver cannot accurately sample or sense the input 410. Likewise, the multi-thresholdreceiver cannot sample or sense the input 510 using the mid-point of $V_{max}$ and $V_{min}$ during this period of uncertainty. To remove the period of uncertainty, the multi-thresholdreceiver outputs a logical "0" when Vn 510*b* rises from Vmin (0 V) going above 50 mV because the input 510 received is likely transitioning to a logical "0". As shown in FIG. 5, the multi-thresholdreceiver latches the transition of Vn—50 mV 550 from low to high to cause the output 560 of the multi-thresholdreceiver to go from logical "1" to logical "0" at time T1. This transition is also referred to as a "latch low" event in the following discussion. The multi-thresholdreceiver may then hold the output 560 at logical "0" through a time period approximately equal to the period of uncertainty 422 (i.e., 2×Tprop) in the conventional receiver and then samples the input 510 again. As such, the period in which the output 560 is at logical "0" is equal to the sum of the sampling time of the multi-threshold receiver and twice the propagation delay (2×Tprop).

Likewise, when the receiver input 510 transitions from a logical "0" to a logical "1", it is observed that Vp 510*a* rises from Vmin (0 mV) going above 50 mV and Vn 510*b* falls from Vmax (200 mV) dropping below 150 mV. Therefore, the multi-thresholdreceiver puts a logical "1" at its output 560 when Vp 510*a* rises from Vmin (0 mV) going above 50 mV, instead of waiting until the period of uncertainty 422 has passed to sample the input 510. In one implementation, the multi-thresholdreceiver latches the transition of Vp—50 mV 540 from low to high to cause the multi-thresholdreceiver output 560 to transition from logical "0" to logical "1" at time T2. This transition is also referred to as a "latch high" event in the following discussion. One of skill in the art should appreciate that the above described implementation is one of many ways to implement multi-thresholdsensing. Other internal signals (e.g., Vp—150 mV or Vn—150 mV) and trigger voltages of other values (e.g., 150 mV) can be used in different implementations to realize the technique of multi-thresholdsensing described herein. To further illustrate the operation of some implementations of the multi-thresholdreceiver, FIG. 6 shows another waveform diagram.

Figure 6A:
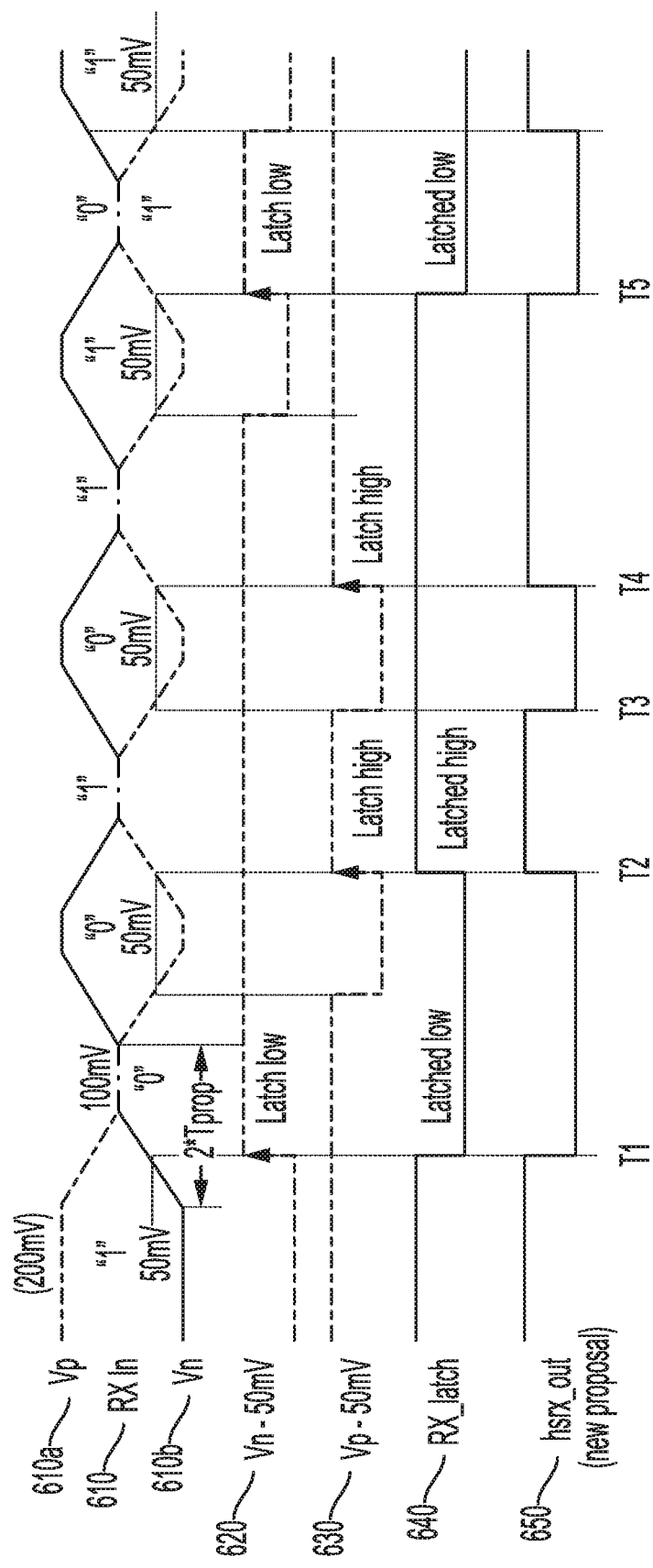
FIG. 6A illustrates input and output waveforms of one implementation of a multi-threshold sensing receiver.

FIG. 6A shows a waveform diagram of some implementations of a multi-thresholdreceiver. The waveform diagram includes an input 610 received by the multi-thresholdreceiver (which includes a pair of differential signals Vp 610*a* and Vn 610*b*), an internal signal Vn—50 mV 620, an internal signal Vp—50 mV 630, an internal signal RX_latch 640, and an output of the multi-thresholdreceiver hsrx_out 650. Similar to the example shown in FIG. 5, the maximum input voltage Vmax is the voltage provided by a low drop-out regulator (LDO) of the slave, which is at 200 mV, and the minimum input voltage Vmin is at 0 V in the current example.

In this implementation of the multi-thresholdreceiver, the internal signal RX_latch 640 is generated based on the "latch high" and "latch low" events discussed above with reference to FIG. 5. Specifically, RX_latch 640 goes low upon a "latch low" event and goes high upon a "latch high" event. Referring to FIG. 6, when Vn—50 mV 620 transitions from low to high at T1, i.e., a "latch low" event, RX_latch 640 goes low. At T2, when Vp—50 mV transitions from low to high, i.e., a "latch high" event, RX_latch 640 goes high. At T4, Vp—50 mV transitions from low to high, i.e., another "latch high" event has occurred. However, since RX_latch 640 is already high, RX_latch 640 remains high and there is no transition of RX_latch 640 at T4. Finally, at T5, Vn—50 mV transitions from low to high, i.e., a "latch low" event, causing RX_latch 640 to go from high to low. The multi-threshold receiver can perform additional logical operations on RX_latch and one or more internal signals to determine the output 650 of the multi-thresholdreceiver.

In some implementations, logical operations are applied to RX_latch 640, Vn—50m V620, and Vp—50 mV 630 to determine the output hsrx_out 650 of the multi-thresholdreceiver. Specifically, RX_latch 640 is AND'd with Vp—50 mV 630, and the result is then OR'd with the inverted version of Vn—50 mV 620 (Vn—50 mV_b). Referring to FIG. 6, both RX_latch 640 and Vp—50 mV 630 are high before T1. Thus, (RX_latch AND Vp—50 mV) results in a high logic value, which is then OR'd with Vn—50 mV_b to produce hsrx_out 650. Because (RX_latch AND Vp—50 mV) is high, the result of (RX_latch AND Vp—50 mV) OR Vn—50 mV_b is high, regardless of the value of Vn—50 mV_b. Therefore, hsrx_out 650 is high before T1. At T1, RX_latch 640 transitions to low, thus, causing (RX_latch AND Vp—50 mV) to become low as well. Vn—50 mV 520 goes high at T1, thus Vn—50 mV_b goes low at T1. Thus, (RX_latch AND Vp—50 mV) OR Vn—50 mV_b becomes low at T1. At T2, RX_latch 640 goes back to high. Vp—50 mV 630 also transitions to high at T2, and thus, (RX_latch AND Vp—50 mV) goes high at T2. Again, because (RX_latch AND Vp—50 mV) is high, the result of (RX_latch AND Vp—50 mV) OR Vn—50 mV_b is high, regardless of the value of Vn—50 mV_b. Therefore, hsrx_out 650 goes back to high at T2. At T3, Vp—50 mV 630 goes low, thus, causing (RX_latch AND Vp—50 mV) to go low as well. Vn—50 mV 620 is high at T3, thus, Vn—50 mV_b is low at T3. Therefore, (RX_latch AND Vp—50 mV) OR Vn—50 mV_b becomes low at T3. At T4, Vp—50 mV 630 goes back to high, while RX_latch 640 remains high. Thus, (RX_latch AND Vp—50 mV) becomes high at T4. Again, because (RX_latch AND Vp—50 mV) is high, the result of (RX_latch AND Vp—50 mV) OR Vn—50 mV_b is high, regardless of the value of Vn—50 mV_b. Therefore, hsrx_out 650 goes back to high at T4. At T5, RX_latch 640 goes low. Thus, (RX_latch AND Vp—50 mV) also goes low. Vn—50 mV 620 goes high at T5, thus, Vn—50 mV_b goes low at T5. As such, (RX_latch AND Vp—50 mV) OR Vn—50 mV_b becomes low at T5, i.e., hsrx_out 650 goes low at T5.

As shown in FIG. 6A, the multi-thresholdreceiver output waveform hsrx_out 650 correctly tracks the input 610 to the multi-thresholdreceiver. In other words, the logic value of hsrx_out 650 matches the logic values of the input 610 (as indicated in the "eye" of the input 610 waveform) throughout the entire time period (from T1 through T4) shown in FIG. 6A. Not only the output 650 of the multi-threshold receiver tracks the input 610 correctly, the output 650 does not have any period of uncertainty even though the multi-threshold receiver is within a near end slave, unlike the conventional receiver discussed above with respect to the output waveform 420 in FIG. 4.

Figure 6B:
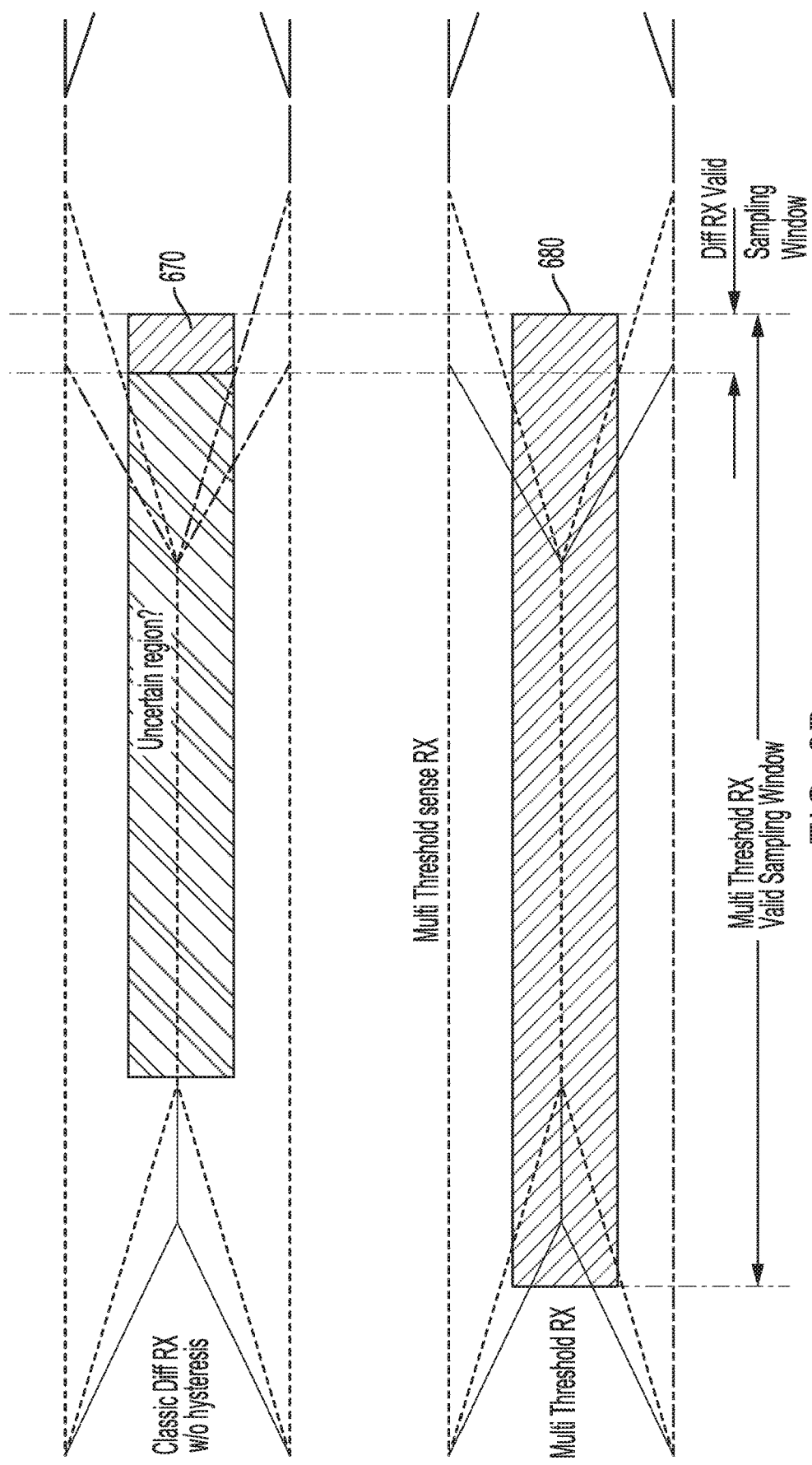
FIG. 6B shows the eye opening of a conventional differential receiver and the eye opening of one implementation of a multi-threshold receiver.

Audio receivers incorporating the multi-threshold sensing technique discussed above can provide wider eye opening (or sampling window) than conventional zero cross over switching receiver. For example, as shown in FIG. 6B, the eye opening of one implementation of a multi-threshold receiver 680 is significantly wider than the eye opening of a conventional differential receiver 670.

Figure 7A:
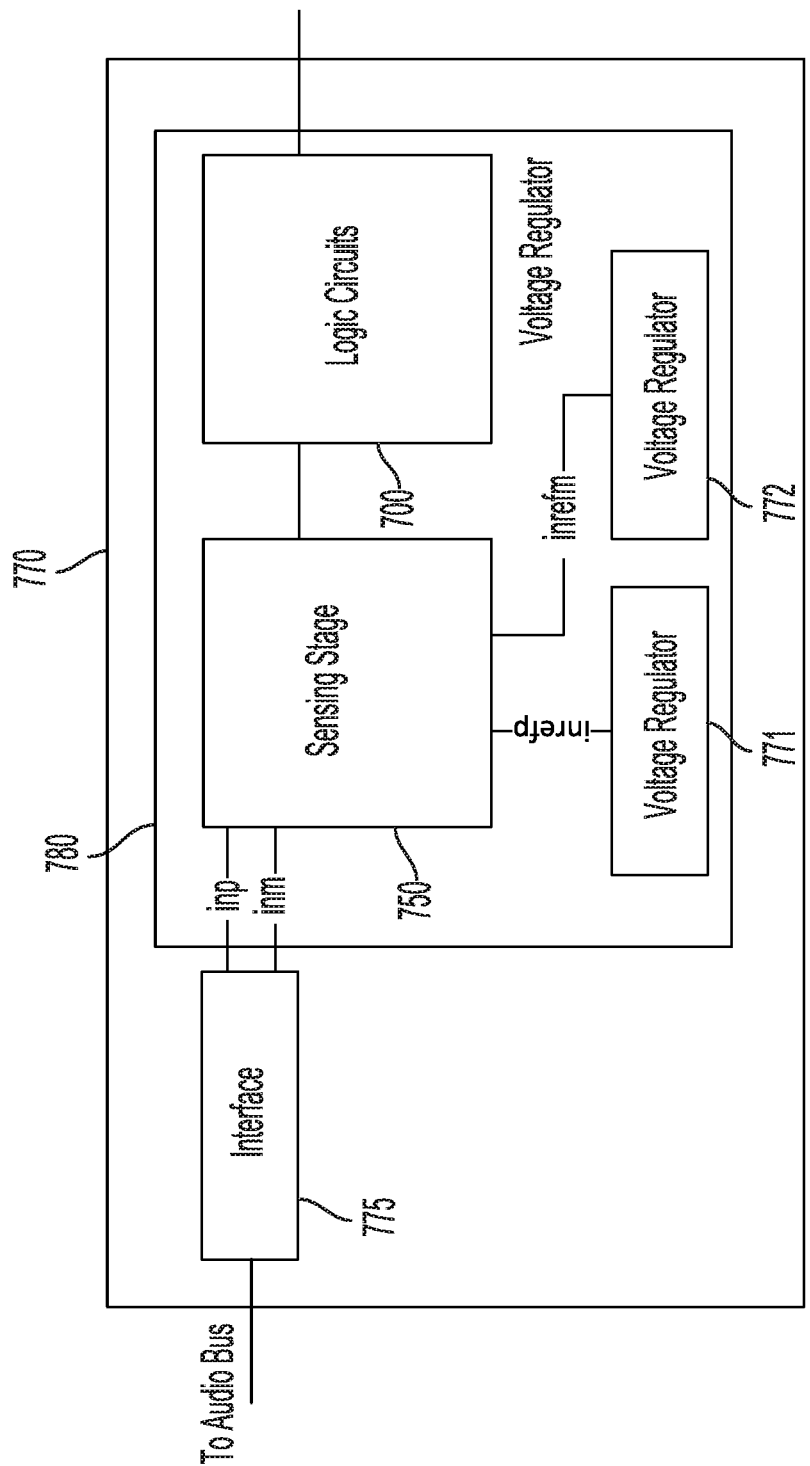
FIG. 7A shows one implementation of an audio slave device capable of multi-threshold sensing.

FIG. 7A shows one implementation of an audio slave device capable of multi-threshold sensing. The audio slave device 770 includes an interface 775 and a multi-threshold receiver 780, which has a first voltage regulator 771, a second voltage regulator 772, a sensing stage 7590, and a logic circuit 700. Interface 775 has inputs and outputs. The inputs of interface 775 are configured to communicatively couple to an audio bus (e.g., the SOUNDWIRE audio bus 333 in FIG. 3C) to receive audio signals from the audio bus. The outputs of interface 775 are coupled to sensing stage 750 of multi-threshold receiver 780. In the current example, the outputs from interface 775 to sensing stage 750 are signals inp and inm. Within multi-threshold receiver 780, the first voltage regulator 771 is coupled to sensing stage 750 to provide a first reference signal inrefp to sensing stage 750. Likewise, the second voltage regulator 772 is coupled to sensing stage 750 to provide a second reference signal inrefm to sensing stage 750. Using the reference signals inrefp and inrefm, sensing stage 750 senses the input signals inp and inm and generates output signals, which are provided to logic circuit 700. Logic circuit 700 can perform logic operations on the outputs from sensing stage 750 based on latching events within the receiver 780. Details of sensing stage 750 and logic circuit 700 are further discussed below with reference to FIGS. 7B and 7C, respectively.

Figure 7B:
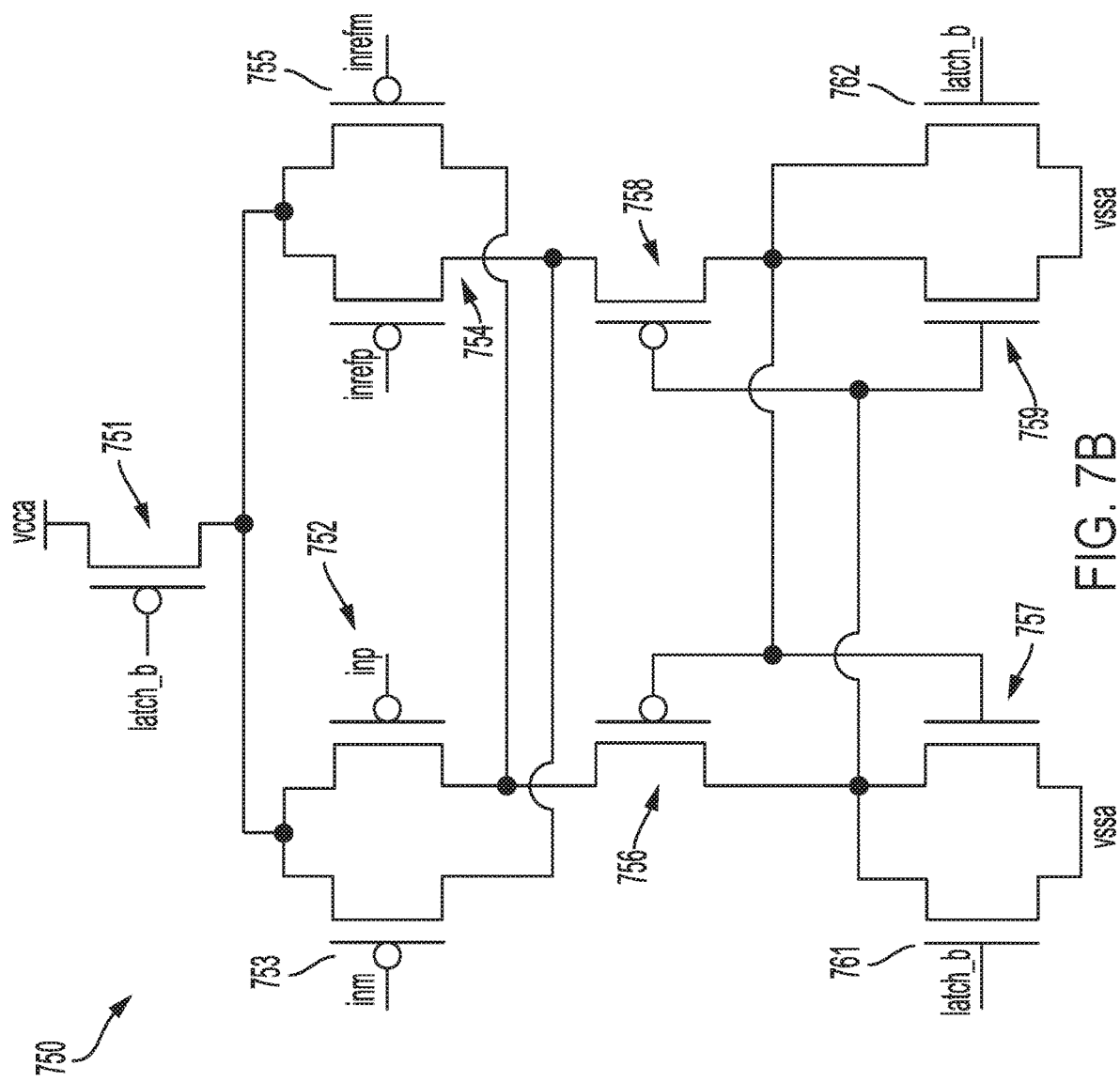
FIG. 7B shows one implementation of a sensing stage of a multi-threshold receiver to receive audio input signals in an audio slave device.

FIG. 7B shows one implementation of a sensing stage 750 of a multi-threshold receiver to receive audio input signals in a slave device (e.g., one of the slave devices 334a in FIG. 3) in an audio system. Sensing stage 750 is implemented using p-type field effect transistors (pFET) and n-type field effect transistors (nFET). Specifically, sensing stage 750 includes pFETs 751, 752, 753, 754, 755, 756, and 768; and nFETs 757, 759, 761, and 762. A source of pFET 751 is coupled to a power supply vcca and a drain of pFET 751 is coupled to the sources of pFETs 752-755. The gate of pFET 751 is configured to receive a signal latch_b. The gate of pFET 752 is configured to receive an input signal inp, while the gate of pFET 753 is configured to receive an input signal inm. The input signals inp and inm constitute an input differential pair input to sensing stage 750. The gate of pFET 754 is configured to receive a reference signal inrefp, while the gate of pFET 755 is configured to receive a reference signal inrefm. In the example discussed above with reference to FIGS. 5 and 6, inrefp is 150 mV and inrefm is 50 mV. Further, the sensitivity of the receiver can be set by the voltage difference between inrefp and inrefm. One skilled in the art would appreciate that other values of inrefp and inrefm can be chosen in different implementations to adjust or optimize the sensitivity of the receiver for any given audio system topology.

The pair of pFET 756 and nFET 757 are coupled to each other at their gates and the drains to form a first inverter. Likewise, the pair of pFET 758 and nFET 759 are coupled to each other at their gates and the drains to form a second inverter. The gates of pFET 756 and nFET 757 are further coupled to the drains of pFET 758 and nFET 759. Likewise, the gates of pFET 758 and nFET 759 are further coupled to the drains of pFET 756 and nFET 757. The cross-coupled first and second inverters are configured into a latch. Furthermore, the drain of nFET 761 is coupled to the drains of pFET 756 and nFET 757, while the source of nFET 761 is coupled to vssa (e.g., ground). Likewise, the drain of nFET 762 is coupled to the drains of pFET 758 and nFET 759, while the source of nFET 762 is coupled to vssa (e.g., ground). The gates of both nFET's 761 and 762 are configured to receive the signal latch_b.

In one implementation, pFET 751 and nFET's 761 and 762 can be configured to initialize (or reset) the receiver in response to receiving a high latch_b signal. The high latch_b signal can turn on nFET's 761 and 762, thus, pulling down the outputs of the first and second inverters (e.g., if vssa is ground, then the outputs of the first and second inverters would be pulled to ground). The high latch_b signal can turn off pFET 751, thus cutting off power supply (i.e., vdda) from the rest of sensing stage 750.

During operation, the input differential pair (i.e., inp and inm) is compared against the differential pair of reference signals (i.e., inrefp and inrefm). When the input differential pair passes the differential pair of reference signals (i.e., the input crossing the threshold), more current will flow through the respective branch to cause the latch to latch an updated data value to be output by sensing stage 750. When latch is activated (i.e., latch_b goes low), the data corresponding to inp and inm will be latched in the latch (i.e., the first and second inverters). For example, suppose inp falls below inrefp. Then more current will flow through pFET 752 while less current will flow through pFET 754. Since inm is complementary to inp, inm will rise above inrefm at the same time, causing more current to flow through pFET 755 and less current to flow through pFET 753. When latch_b goes low, pFET 751 is turned on, allowing current to flow through pFETs 752-755 as described above. Note that more current flows into the first inverter (comprising pFET 756 and nFET 757) than the second inverter (comprising pFET 758 and nFET 759), thus making the first inverter the powered (or stronger) inverter among the two. As the input of the first inverter has been pulled down initially as described above, the first inverter will output a high voltage (corresponding to logic "1"), which is input to the second inverter. The second inverter will therefore output a low voltage (corresponding to logic "0"), hence, reinforcing the data stored in the latch (i.e., the cross-coupled first and second inverters). The output voltages of the first and second inverters (i.e., the voltages at the drains of nFET 757 and 759, respectively) are output to logic circuit 700.

Note that the receiver sensitivity can be set by the voltage difference between inrefp and inrefm. Those levels can be adjusted or optimized for any given audio system topology. Further, the receiver has excellent noise immunity compared to conventional single-ended designs. As the voltage difference between inrefp and inrefm sets the receiver threshold, the receiver thus has good common-mode noise immunity. In other words, if inrefp and inrefm have common noise, that gets canceled out by the receiver circuit architecture shown in FIG. 7B.

In some implementations, sensing stage 750 can output the data to another logic circuit (or logic block) within the receiver. The other logic circuit can generate signals internal to the receiver 780 based on the latching events, and perform logic operations on these internal signals to determine the output of the receiver 780 such as, for example, according to the discussion of the waveforms shown in FIGS. 5 and 6. One implementation of the other logic circuit is shown in FIG. 7C to illustrate the concept. One skilled in the art would appreciate that other implementations may define a different set of latching events and logic operations in order to determine the receiver output.

FIG. 7C shows one implementation of a logic circuit of a multi-thresholdthreshold receiver. Logic circuit 700 includes an inverter 710, an OR gate 720, and an AND gate 730. Inverter 710 receives the signal Vn—50 mV (e.g., Vn—50 mV 630 in FIG. 6) at its input and outputs Vn—50 mV_b to a first input of AND gate 730. OR gate 720 receives a signal RX_latch (e.g., RX_latch 640 in FIG. 6) and a signal Vp—50 mV (e.g., Vp—50 mV 630 in FIG. 6) at its two input terminals. An output terminal of OR gate 720 is coupled to a second input of AND gate 730. Thus, the signal representing (RX_latch OR Vp—50 mV) is input to AND gate 730. AND gate 730 performs AND operation on its inputs (i.e., Vn—50 mV_b and (RX_latch OR Vp—50 mV) to produce an output of the receiver hsrx_out (e.g., hsrx_out 650 in FIG. 6).

Calibration of Audio System

As discussed above, the receiver at a near end slave and the receiver at a far end slave in a SOUNDWIRE-Next audio system may sample data received in different manner in order to provide the optimum bandwidth. Thus, it is useful for the master in a SOUNDWIRE-Next audio system to determine (or to distinguish) a short transmission line from a long transmission line so that optimal setting may be used for slew-rate setting, output differential voltage (Vod), and the optimal sense level for the multi-threshold receiver. In addition, calibration of the master can also compensate for manufacturing variations in the PHYs and interconnect. Some implementations of a method to calibrate a master in a SOUNDWIRE-Next audio system are discussed in detail below.

Figure 8A:
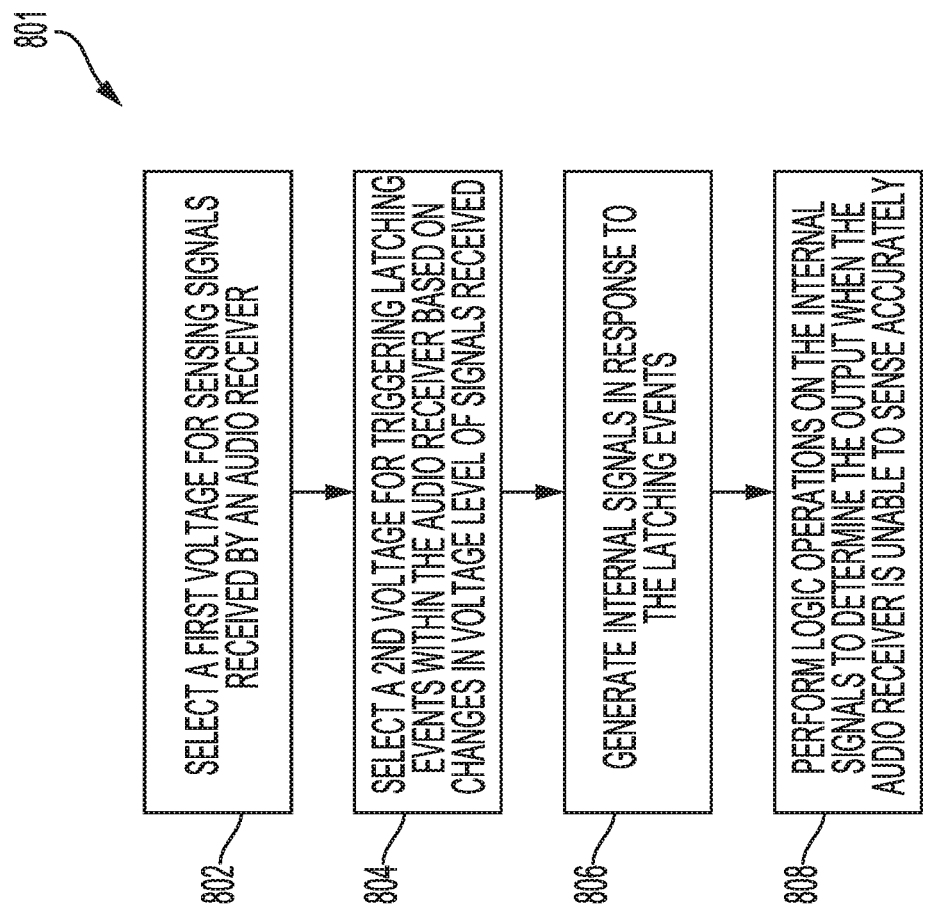
FIG. 8A shows a flow diagram of a method to perform multi-threshold sensing in a receiver of an audio system.

FIG. 8A shows a flow diagram of one implementation of a method 801 to perform multi-threshold sensing in a receiver of an audio system. The method 801 can be performed by the hardware and system described above.

Referring to FIG. 8A, the method begins by selecting a first voltage for sensing signals received at an audio receiver (block 802). The audio receiver can be a near end slave receiver in an audio system. The method 801 continues by selecting a second voltage for triggering latching events within the audio receiver based on changes in voltage level of the signals received (block 804). Some examples of the latching events have been described above with reference to FIGS. 5-6. Then the method 801 generates a plurality of internal signals within the audio receiver in response to the latching events (block 806). Some examples of the internal signals have been described above with reference to FIGS. 5-6. Finally, the method 801 performs logic operations on the internal signals to determine a value of an output of the audio receiver when the audio receiver is unable to sense accurately (block 808).

Figure 8B:
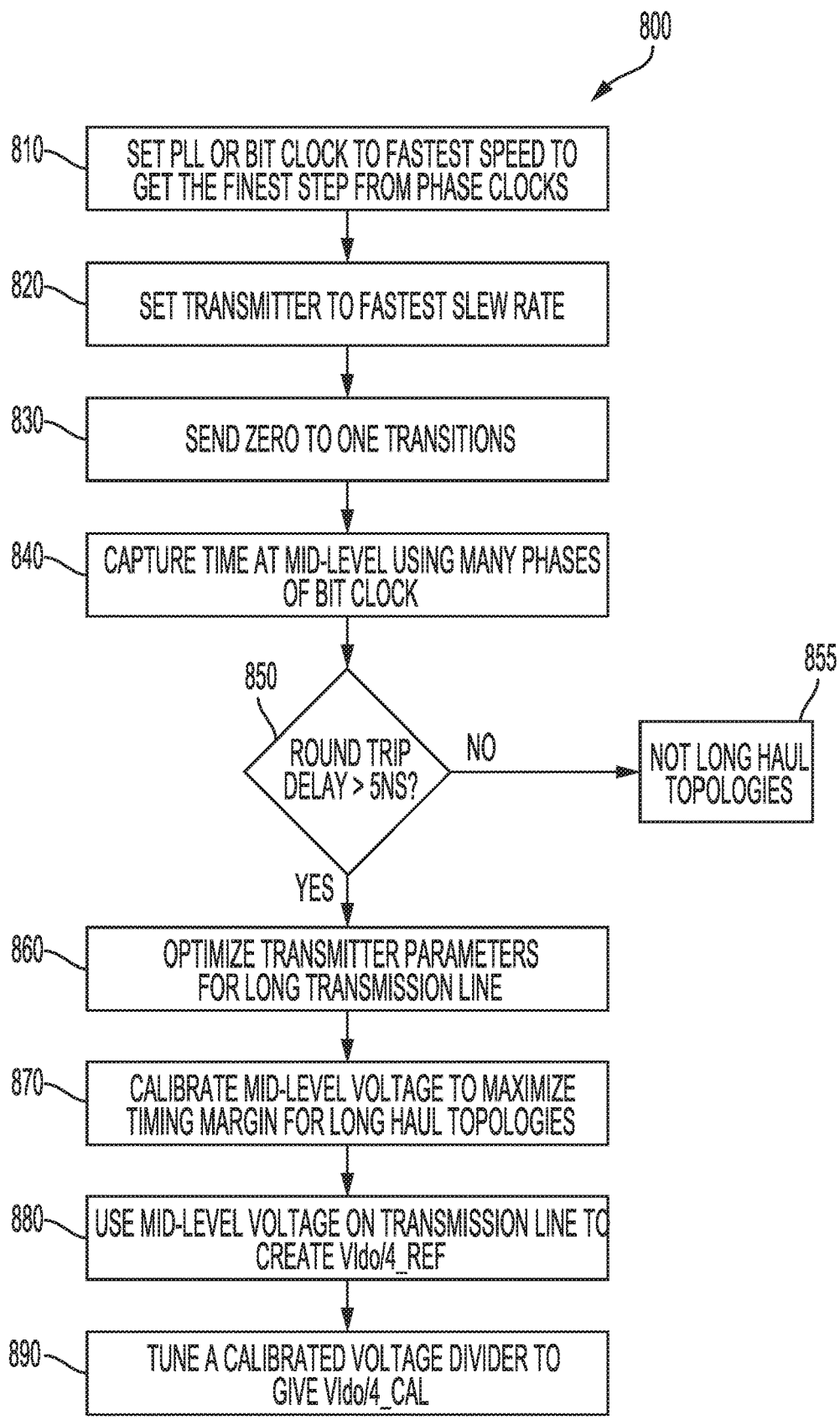
FIG. 8B shows a flow diagram of a method to calibrate a master in a SOUNDWIRE-Next audio system.
Figure 9:
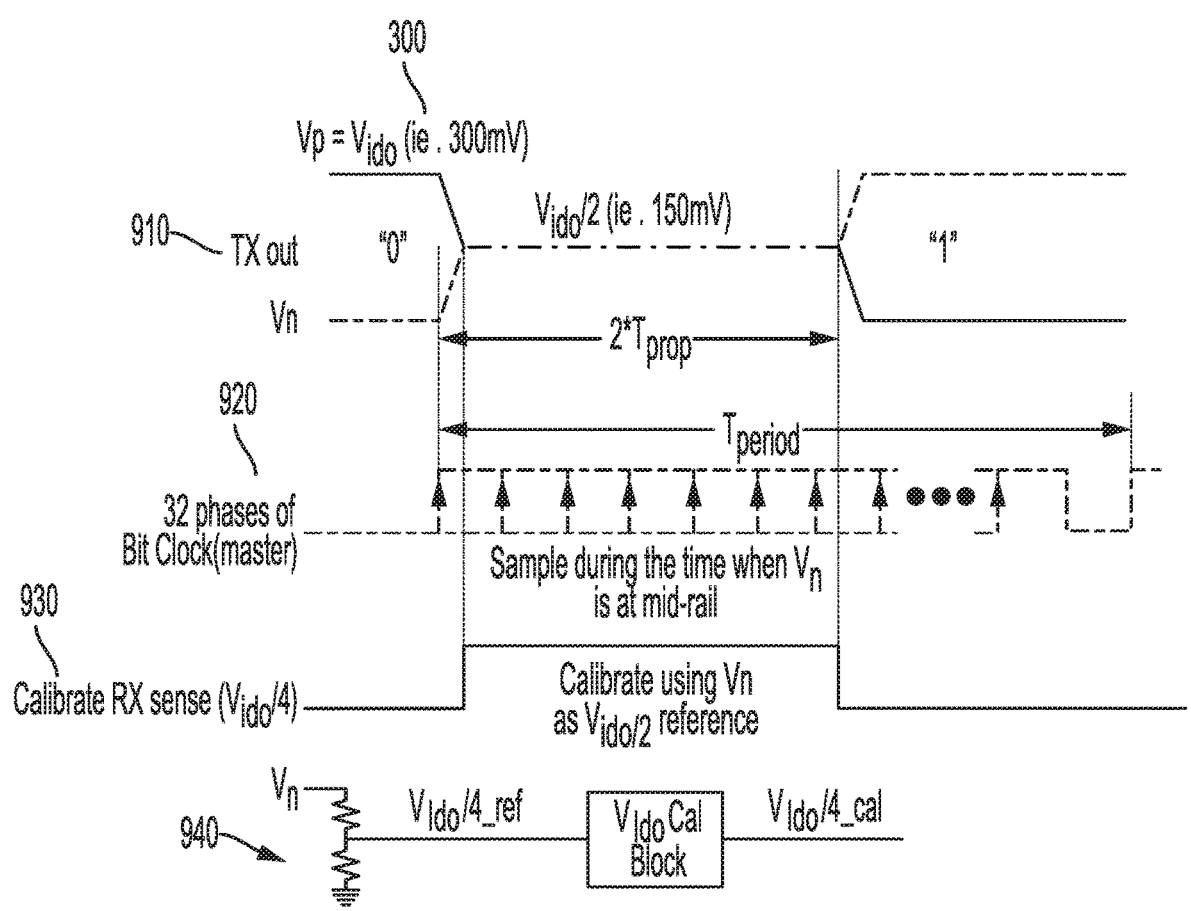
FIG. 9 shows waveforms of signals during calibration in one implementation and a circuit diagram of one implementation of a voltage divider used in part of the calibration process.

FIG. 8B shows a flow diagram of a method to calibrate a master in a SOUNDWIRE-Next audio system. The operations described in the flow diagram may be performed by hardware (e.g., phase locked loop, comparator, etc.), software (e.g., code or instruction executable by a processor), firmware, or a combination of any of the above. FIG. 9 shows waveforms of signals during calibration in one implementation and a circuit diagram of one implementation of a voltage divider used in part of the calibration process. In describing details of the calibration method below, references will be made to both FIGS. 8 and 9.

Referring to FIG. 8B, the method 800 starts at block 810, where a phase locked loop (PLL) or a bit clock in the master is set at the fastest speed (e.g., 76 Mbps or 13 ns) to get the finest step from phase clocks. Then the method 800 transitions to block 820, where a transmitter at the master is set at the fastest slew rate. Then the method 800 transitions to block 830, where the transmitter sends a signal carrying a series of zero ("0") to ("1") transitions, a portion of which is represented by the TX out waveform 910 in FIG. 9. TX out 910 includes a pair of differential signal, namely Vn and Vp. Vp is at the output voltage provided by a low drop-out regulator (LDO) $V_{ldo}$. In the current example, $V_{ldo}$, is at about 300 mV. Next, the method transitions to block 840, where the signal is sampled during the time when Vn is at mid-level (a.k.a. mid-rail) using many phases of the bit clock, as illustrated by waveform 920 in FIG. 9. In the current example, the mid-level voltage is about 150 mV and the bit clock has 32 phases, which translates to 400 ps step size at 76 MHz.

In block 850, the master checks if the round trip delay of the signal is greater than a predetermined time period. If so, then it can be inferred that the transmission line is long, that is, the master is in a long haul topology, and the transmitter parameters can be optimized (block 860). Otherwise, the master is not in a long haul topology (block 855). In the current example, the predetermined time period is about 5 ns. From block 860, the method 800 transitions to block 870, where the mid-level voltage is calibrated to maximize timing margin for long haul topologies.

In some implementations, the method 800 further determines the optimal sense level for the multi-threshold receiver as further described below. From block 870, the method 800 transitions to block 880 to use Vn on the transmission line, which is at the mid-level voltage $V_{ldo}/2$, as a reference voltage to create a voltage approximately equal to $V_{ldo}$ divided by four (4) Vldo/4 ref. This is illustrated by the waveform 930 in FIG. 9. The method 800 further tunes a calibrated voltage divider (such as voltage divider 940 in FIG. 9) at the master to give a voltage Vldo/4 cal (block 890). In some implementations, the voltage divider 940 can be tuned to about ¼ of $V_{ldo}$.

The systems and methods for multi-threshold sensing in a slave's receiver and calibration of the master in a SOUNDWIRE-Next audio bus according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
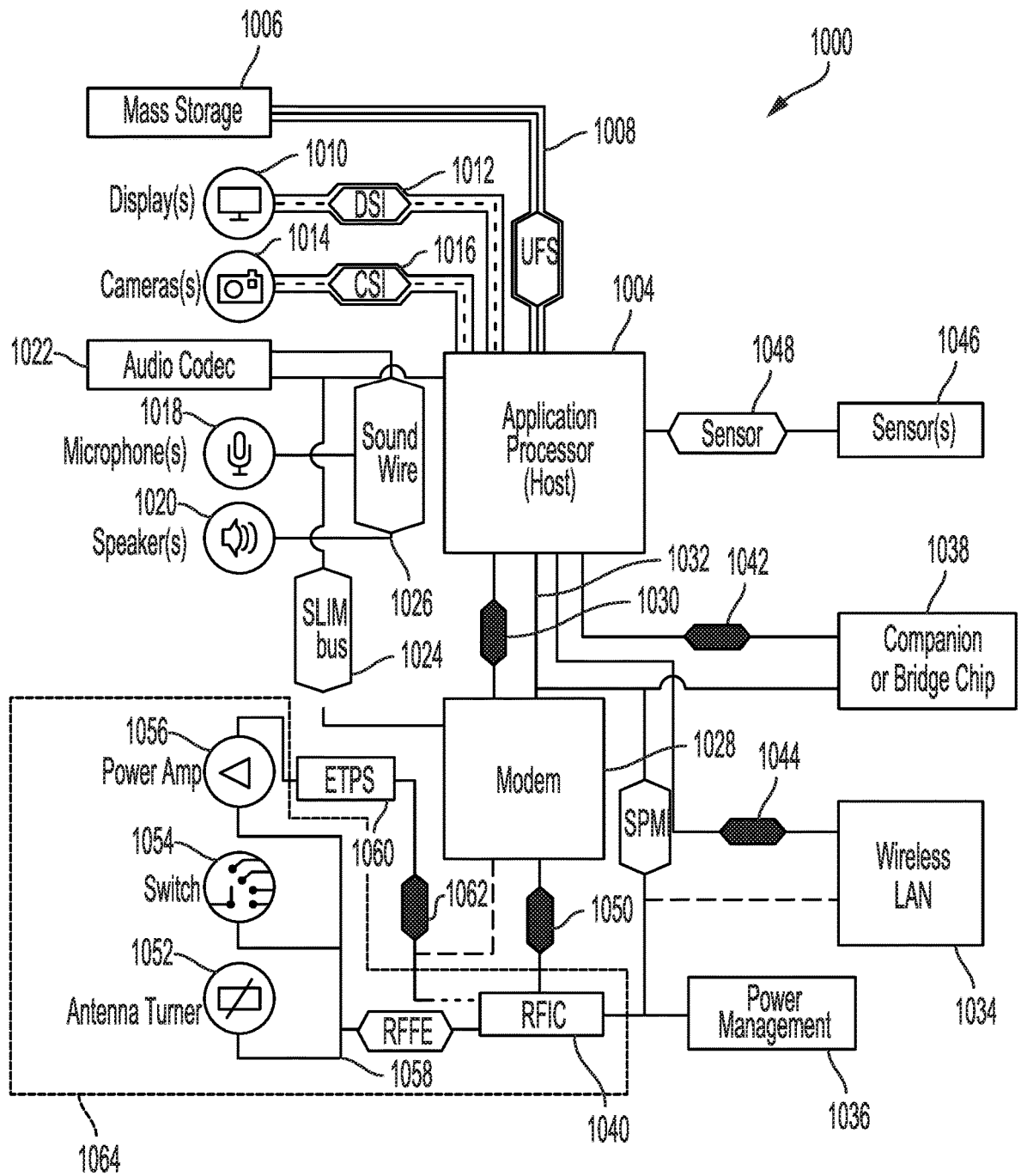
FIG. 10 is a block diagram of an exemplary processor-based system that can include the SOUNDWIRE audio system of FIG. 1 that performs the processes of multi-threshold sensing at an audio receiver and/or calibration of an audio system.

In this regard, FIG. 10 is a system-level block diagram of an exemplary mobile terminal 1000 such as a smart phone, mobile computing device tablet, or the like. While a mobile terminal having a SOUNDWIRE bus is particularly contemplated as being capable of benefiting from exemplary aspects of the present disclosure, it should be appreciated that the present disclosure is not so limited and may be useful in any system having a time division multiplexed (TDM) bus.

With continued reference to FIG. 10, the mobile terminal 1000 includes an application processor 1004 (sometimes referred to as a host) that communicates with a mass storage element 1006 through a universal flash storage (UFS) bus 1008. The application processor 1004 may further be connected to a display 1010 through a display serial interface (DSI) bus 1012 and a camera 1014 through a camera serial interface (CSI) bus 1016. Various audio elements such as a microphone 1018, a speaker 1020, and an audio codec 1022 may be coupled to the application processor 1004 through a serial low-power interchip multimedia bus (SLIMBUS) 1024. Additionally, the audio elements may communicate with each other through a SOUNDWIRE bus 1026. A modem 1028 may also be coupled to the SLIMBUS 1024 and/or the SOUNDWIRE bus 1026. The modem 1028 may further be connected to the application processor 1004 through a peripheral component interconnect (PCI) or PCI express (PCIe) bus 1030 and/or a system power management interface (SPMI) bus 1032.

With continued reference to FIG. 10, the SPMI bus 1032 may also be coupled to a wireless local area network (LAN or WLAN) IC (LAN IC or WLAN IC) 1034, a power management integrated circuit (PMIC) 1036, a companion IC (sometimes referred to as a bridge chip) 1038, and a radio frequency IC (RFIC) 1040. It should be appreciated that separate PCI buses 1042 and 1044 may also couple the application processor 1004 to the companion IC 1038 and the WLAN IC 1034. The application processor 1004 may further be connected to sensors 1046 through a sensor bus 1048. The modem 1028 and the RFIC 1040 may communicate using a bus 1050.

With continued reference to FIG. 10, the RFIC 1040 may couple to one or more RFFE elements, such as an antenna tuner 1052, a switch 1054, and a power amplifier 1056 through a radio frequency front end (RFFE) bus 1058. Additionally, the RFIC 1040 may couple to an envelope tracking power supply (ETPS) 1060 through a bus 1062, and the ETPS 1060 may communicate with the power amplifier 1056. Collectively, the RFFE elements, including the RFIC 1040, may be considered an RFFE system 1064. It should be appreciated that the RFFE bus 1058 may be formed from a clock line and a data line (not illustrated).

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An audio slave device, comprising:
   an interface configured to communicatively couple to an audio bus to receive audio signals from an audio master device; and
   an audio receiver coupled to the interface, the audio receiver comprising
   a first voltage regulator configured to generate a first voltage;
   a second voltage regulator configured to generate a second voltage different from the first voltage;
   a plurality of transistors configured to generate a plurality of internal signals internal to the audio receiver based on the second voltage and changes in voltage level of the audio signals received, and
   a logic circuit configured to determine a value of an output of the audio receiver based on the plurality of internal signals during a period in which the audio receiver is not sensing the audio signals received using the first voltage, the logic circuit comprising an AND gate having an output to generate the output of the audio receiver, a first input configured to receive an inverted signal of the second voltage, and a second input; and an OR gate having an output coupled to the second input of the AND gate, and a first input configured to receive a third voltage and a second input configured to receive one of the plurality of internal signals, wherein the third voltage is different from the first and the second voltages.

2. The audio slave device of claim 1, wherein the first voltage is a mid-point voltage between a maximum voltage and a minimum voltage of the audio signals received.

3. The audio slave device of claim 2, wherein the second voltage is at about three quarters of a range of voltage between the maximum voltage and the minimum voltage of the audio signals received.

4. The audio slave device of claim 1, wherein the third voltage is at about a quarter of the range of voltage between the maximum voltage and the minimum voltage of the audio signals received.

5. An audio slave device, comprising:
an interface configured to communicatively couple to an audio bus to receive audio signals from an audio master device; and
an audio receiver coupled to the interface, the audio receiver configured to perform multi-threshold sensing on the audio signals received from the interface, wherein the audio receiver comprises
a first voltage regulator configured to generate a first voltage for sensing the audio signals received, wherein the first voltage is a mid-point voltage between a maximum voltage and a minimum voltage of the audio signals received;
a second voltage regulator configured to generate a second voltage different from the first voltage, wherein the second voltage is at about three quarters of a range of voltage between the maximum voltage and the minimum voltage of the audio signals received;
a plurality of transistors configured to generate a plurality of internal signals internal to the audio receiver based on the second voltage and changes in voltage level of the audio signals received; and
a logic circuit configured to determine a value of an output of the audio receiver based on the plurality of internal signals during a period in which the audio receiver cannot sense the audio signals received using the first voltage, wherein the logic circuit comprises
an AND gate having an output to generate the output of the audio receiver, a first input configured to receive an inverted signal of the second voltage, and a second input; and
an OR gate having an output coupled to the second input of the AND gate, and a first input configured to receive a third voltage and a second input configured to receive one of the plurality of internal signals, wherein the third voltage is at about a quarter of the range of voltage between the maximum voltage and the minimum voltage of the audio signals received.

6. The audio slave device of claim 5, wherein the plurality of transistors comprise:

a first pair of p-type field effect transistors (pFET's) having a first pFET and a second pFET, the first pFET and the second pFET configured to receive the audio signals at their gates; and a second pair of pFET's having a third pFET and a fourth pFET, a gate of the third pFET configured to receive the first voltage from the first voltage regulator and a gate of the fourth pFET configured to receive the second voltage from the second voltage regulator.

7. The audio slave device of claim 6, wherein the plurality of transistors comprise:

a fifth pFET and a first n-type field effect transistor (nFET) coupled to each other at their gates and drains to form a first inverter; and a sixth pFET and a second nFET coupled to each other at their gates and drains to form a second inverter.

8. The audio slave device of claim 7, wherein the first inverter and the second inverter are cross-coupled and configured into a latch.

9. An audio system, comprising:
an audio master device;
an audio bus; and
a first audio slave device coupled to the audio master device via the audio bus, wherein a length of the audio bus between the audio master device and the first audio slave device is less than 50 centimeters, and the audio slave device includes
an interface configured to communicatively coupled to the audio bus to receive audio signals from the audio master device, and
an audio receiver coupled to the interface, the audio receiver configured to perform multi-threshold sensing on the audio signals received from the interface, the audio receiving having
a first voltage regulator configured to generate a first voltage for sensing the audio signals received;
a second voltage regulator configured to generate a second voltage different from the first voltage;
a plurality of transistors configured to generate a plurality of internal signals internal to the audio receiver based on the second voltage and changes in voltage level of the audio signals received; and
a logic circuit configured to determine a value of an output of the audio receiver based on the plurality of internal signals during a period in which the audio receiver cannot sense the audio signals received using the first voltage, wherein the logic circuit comprises:
an AND gate having an output to generate the output of the audio receiver, a first input configured to receive an inverted signal of the second voltage, and a second input; and
an OR gate having an output coupled to the second input of the AND gate, and a first input configured to receive a third voltage and a second input configured to receive one of the plurality of internal signals, wherein the third voltage is at about a quarter of the range of voltage between the maximum voltage and the minimum voltage of the audio signals received.

10. The audio system of claim 9, wherein the plurality of transistors comprise:
a first pair of p-type field effect transistors (pFET's) having a first pFET and a second pFET, the first pFET and the second pFET configured to receive the audio signals at their gates; and a second pair of pFET's having a third pFET and a fourth pFET, a gate of the third pFET configured to receive the first voltage from the first voltage regulator and a gate of the fourth pFET configured to receive the second voltage from the second voltage regulator.

11. The audio system of claim 10, wherein the plurality of transistors comprise:
a fifth pFET and a first n-type field effect transistor (nFET) coupled to each other at their gates and drains to form a first inverter; and
a sixth pFET and a second nFET coupled to each other at their gates and drains to form a second inverter.

12. The audio system of claim 11, wherein the first inverter and the second inverter are cross-coupled and configured into a latch.

* * * * *